(12) United States Patent
Sisler et al.

(10) Patent No.: US 9,912,191 B2
(45) Date of Patent: Mar. 6, 2018

(54) SYSTEM AND METHOD OF POWER CONTROL FOR A HIGH-AVAILABILITY SYSTEM

(71) Applicant: VIOLIN SYSTEMS LLC, San Jose, CA (US)

(72) Inventors: John R. Sisler, Scotts Valley, CA (US); John C. Ottesen, San Ramon, CA (US); Russell T. Baca, Fremont, CA (US); Jean-Phillipe Fricker, Mountain View, CA (US)

(73) Assignee: VIOLIN SYSTEMS LLC, San Jose, CA (US)

( * ) Notice: Subject to any disclaimer, the term of this patent is extended or adjusted under 35 U.S.C. 154(b) by 701 days.

(21) Appl. No.: 14/017,686

(22) Filed: Sep. 4, 2013

(65) Prior Publication Data

US 2014/0063752 A1 Mar. 6, 2014

Related U.S. Application Data

(60) Provisional application No. 61/696,383, filed on Sep. 4, 2012.

(51) Int. Cl.
*G06F 1/00* (2006.01)
*H02J 9/06* (2006.01)
(Continued)

(52) U.S. Cl.
CPC .............. *H02J 9/061* (2013.01); *H02J 1/108* (2013.01); *H05K 7/14* (2013.01); *H05K 7/1492* (2013.01); *Y10T 307/625* (2015.04)

(58) Field of Classification Search
CPC ............ H02B 1/015; H02J 9/061; H05K 7/14
See application file for complete search history.

(56) References Cited

U.S. PATENT DOCUMENTS

| | | | |
|---|---|---|---|
| 2002/0042893 A1* | 4/2002 | Larson | G06F 11/1044 714/5.1 |
| 2006/0101296 A1 | 5/2006 | Mares et al. | |

(Continued)

FOREIGN PATENT DOCUMENTS

| | | |
|---|---|---|
| EP | 1 107 437 A2 | 6/2001 |
| WO | WO 2007/077585 A1 | 7/2007 |
| WO | WO 2010/003469 A1 | 1/2010 |

OTHER PUBLICATIONS

International Search Report and Written Opinion of the International Searching Authority for International Application No. PCT/US2013/057794, dated Dec. 20, 2013, 7 pages.

(Continued)

*Primary Examiner* — Austin Hicks
(74) *Attorney, Agent, or Firm* — Brinks Gilson & Lione

(57) ABSTRACT

Maintenance of reliable and highly available electronic systems to perform servicing and preventive maintenance may need to be performed without interruption of operations. Removal of circuit cards from a chassis may render the connectors on a chassis vulnerable to inadvertent short circuiting of power sources by stray metallic objects. A configuration where the power is removed from a connector as the circuit card is being extracted eliminates his possibility. The control circuits for the power supply connections and the power supplies are themselves redundant so that they may be similarly serviced.

19 Claims, 6 Drawing Sheets

(51) Int. Cl.
*H05K 7/14* (2006.01)
*H02J 1/10* (2006.01)

(56) References Cited

U.S. PATENT DOCUMENTS

| | | |
|---|---|---|
| 2007/0109736 A1 | 5/2007 | Coglitore |
| 2009/0144568 A1* | 6/2009 | Fung .................... G06F 1/3203 713/300 |
| 2009/0271642 A1* | 10/2009 | Cheng .................... G06F 1/263 713/300 |
| 2011/0112704 A1* | 5/2011 | Kibbie ............... H05B 37/0254 700/298 |

OTHER PUBLICATIONS

Specification Sheet for the AEG LS7K Series Lighting Contactors published Sep. 2016; downloaded from Web Site https://www.kele.com/lighting-controls/ls7k-series.aspx, Apr. 12, 2017 (1 pg).

* cited by examiner

SYSTEM AND METHOD OF POWER CONTROL FOR A HIGH-AVAILABILITY SYSTEM

This application claims the benefit of U.S. provisional application Ser. No. 61/696,383, filed on Sep. 4, 2012, which is incorporated herein by reference.

BACKGROUND

Computing systems used in data centers and other environments where reliability and availability is an important performance criteria often use redundant components or modules, so that a failure of any single component or module does not substantially compromise the performance of the system or result in data loss.

For stored data, the desired system reliability characteristics may be achieved by storing duplicate or redundant copies of the data on independently operated memory systems. Active data may be stored, for example, using a RAID concept, where the where a chunk of data is distributed over a plurality of memory modules, and a parity or other error correcting code, is computed from the data being protected by the parity and stored on another memory module. Data may be stored at a plurality of physical locations as well.

To cope with hardware failures (e.g., electronics, fans, prime power), redundant components and power sources may be provided, and the components may transfer a function to the redundant backup component automatically. Moreover, in some systems, a failed component or module may be designed such that the component or module, for example, a circuit card or power supply, may be replaced without interrupting the operation of the system. More often, the system needs to be scheduled for down time so that the failed component may be replaced. Taking a high performance system off line to effect a repair may be problematic, as the system may contain a large amount of data that needs to be continually and rapidly accessed. Systems needing off-line replacement of components thus suffer from a lower availability and may compromise the promised levels of service that is to be provided (e.g., service level agreements, SLA).

Alternatively, redundant electronic modules, for example, may be provided, and such modules may be used to continue the operation of the system. Modules may be designed to "hot swappable", where this term is intended to convey the concept that a failed module may be removed from a larger system and replaced with a working module without taking the system off line to perform the replacement A redundant module may maintain the operation during this interval. The computing system may need to respond to the failure or prepare for such a repair action by providing automatically or manually configured temporary storage for new data, reconstructing lost data using the RAIDed data, connecting a standby component, or the like. From a physical and electrical viewpoint, the failed component or module needs to be capable of being removed from the system and replaced with a working module without causing artifacts on a data bus, causing electrical transients associated with grounding and other connections being made or broken during the removal of a module and the insertion of another module.

In particular, one often arranges that the ground pin on a connector is longer than the power pin of the connector, so that the power, being supplied from a common bus on the motherboard is disconnected from the module before the ground connection is interrupted by withdrawing the module form a mating connector. This same arrangement causes the ground connection to be re-established before power is supplied to the module upon insertion into the connector.

When a module is removed from a chassis, the mating connector on the motherboard or other interface remains connected to the power distribution bus and has power applied thereto. An inadvertent short circuit could cause damage to the power supply and shut down the entire system. Most systems that can be serviced while in operation are configured so that the plane of the modules is vertical and that the direction of motion of the insertion/withdrawal involves horizontal motion. As such the connector is recessed into the chassis and typically has a circuit board or other chassis structure on either side of the blank slot resulting from the removal of a module. In this configuration it is improbably that any foreign object can enter into the recess and short the connector pins. That is, the insertion direction of the module and the possible insertion path of an extraneous object is horizontal when the equipment is being serviced.

However, the physical configuration described above may be inefficient for densely packaged rack mounted chassis as the front-to back chassis dimension is often much greater that an optimum circuit card size. A configuration for a chassis where the modules can be accessed from the top would provide for convenient access to modules interior to the chassis. But, when a chassis is accessible from above, foreign objects may fall into a blank space left by the removal of a circuit card and short pins of the connector.

SUMMARY

An electronics chassis for a high reliability and availability electronic system is described, where the chassis has an interface to a power supply providing a voltage and a plurality of chassis-mounted connectors, each connector having a plurality of contacts sized and dimensioned to be mateable with a circuit card. A power control module may be electrically disposed between the power supply interface and a chassis-mounted connector.

The power control module has a switch disposed between the power supply interface and the connector and electrically connected so that a control circuit of the power control module activates a switch in response to a sense signal. The switch acts to connect the power supply interface and the individual circuit card providing the sense signal.

The power supply may be external to the electronic chassis or be housed in the electronic chassis such that part or all of the power supply is removable for service.

The chassis mounted connector and the mating connector of the circuit card may be arranged and dimensioned such that sense signals are provided to the power control module to indicate that a ground connection has been made between the circuit card and the chassis prior to the connection of the power supply connections of the connector and the circuit card. Another sense signal may be provided to indicate the state of connection between the power supply connections between the power supply connections of the connector and the circuit card.

For example, the connector may be configured to have at least one contact near an end thereof that is connected to a ground, or use the ground connection itself to indicate the connection to the chassis ground system. If the power supply ground is isolated, then the power supply ground is used and sensed.

The connector may also be configured to have at least one contact near the power supply connection and the contact may provide a ground or resistance as a second sense signal. The lengths of the power connection portion of the circuit card, or the corresponding portion of the connector may be dimensioned and positioned such that the state of the connection of the power supply connection is represented by the second sense signal.

In an aspect the arrangement of the connections may be such that the ground connection is made before the power supply connection, and that the second sense signal is activated either before or after the power supply connection is made, depending on whether the voltage is to be supplied to the chassis mounted connector before or after the connector has been mated to effect the physical power supply connection.

In an aspect, the power control circuit may comprises a plurality of OR-connected electronic switches connected between the interface and a chassis-mounted connector of the plurality of chassis mounted connectors. The switch may be activated to permit power voltage to be applied to the connector, depending upon the state of the sense signals. The type of sense signal, the number of sense signals, and the state of the sense signal may depend on the specific operating characteristics desired. More than one group of power control circuits may be provided so that this portion of the electronic chassis may be service without interrupting operations.

In another aspect, the electronic chassis may have a redundant power supply configuration with a pair of voltage converters and a pair of energy storage devices. A voltage converter and an energy storage device may be joined by a connector, and each pair of modules may insertable into a sleeve adapted to receive the pair of voltage converters and the pair of energy storage devices and plugably connected to a load interface. Each of the power supplies is cross connected to both energy storage devices in an OR-type arrangement such that either of the power supplies may supply one or both of the energy storage devices. Each of the energy storage devices is connected to the load interface.

Hence, either of the power supplies may be removed from the sleeve for servicing, or a power supply and an energy storage device may be removed from the sleeve for servicing without interfering with the operation of the equipment of the electronic chassis.

DESCRIPTION

Exemplary embodiments may be better understood with reference to the drawings, but these examples are not intended to be of a limiting nature. Like numbered elements in the same or different drawings perform equivalent functions. Elements may be either numbered or designated by acronyms, or both, and the choice between the representation is made merely for clarity, so that an element designated by a numeral, and the same element designated by an acronym or alphanumeric indicator should not be distinguished on that basis.

When describing a particular example, the example may include a particular feature, structure, or characteristic, but every example may not necessarily include the particular feature, structure or characteristic. This should not be taken as a suggestion or implication that the features, structure or characteristics of two or more examples should not or could not be combined, except when such a combination is explicitly excluded. When a particular feature, structure, or characteristic is described in connection with an example, a person skilled in the art may give effect to such feature, structure or characteristic in connection with other examples, whether or not explicitly described.

Figure 1A:
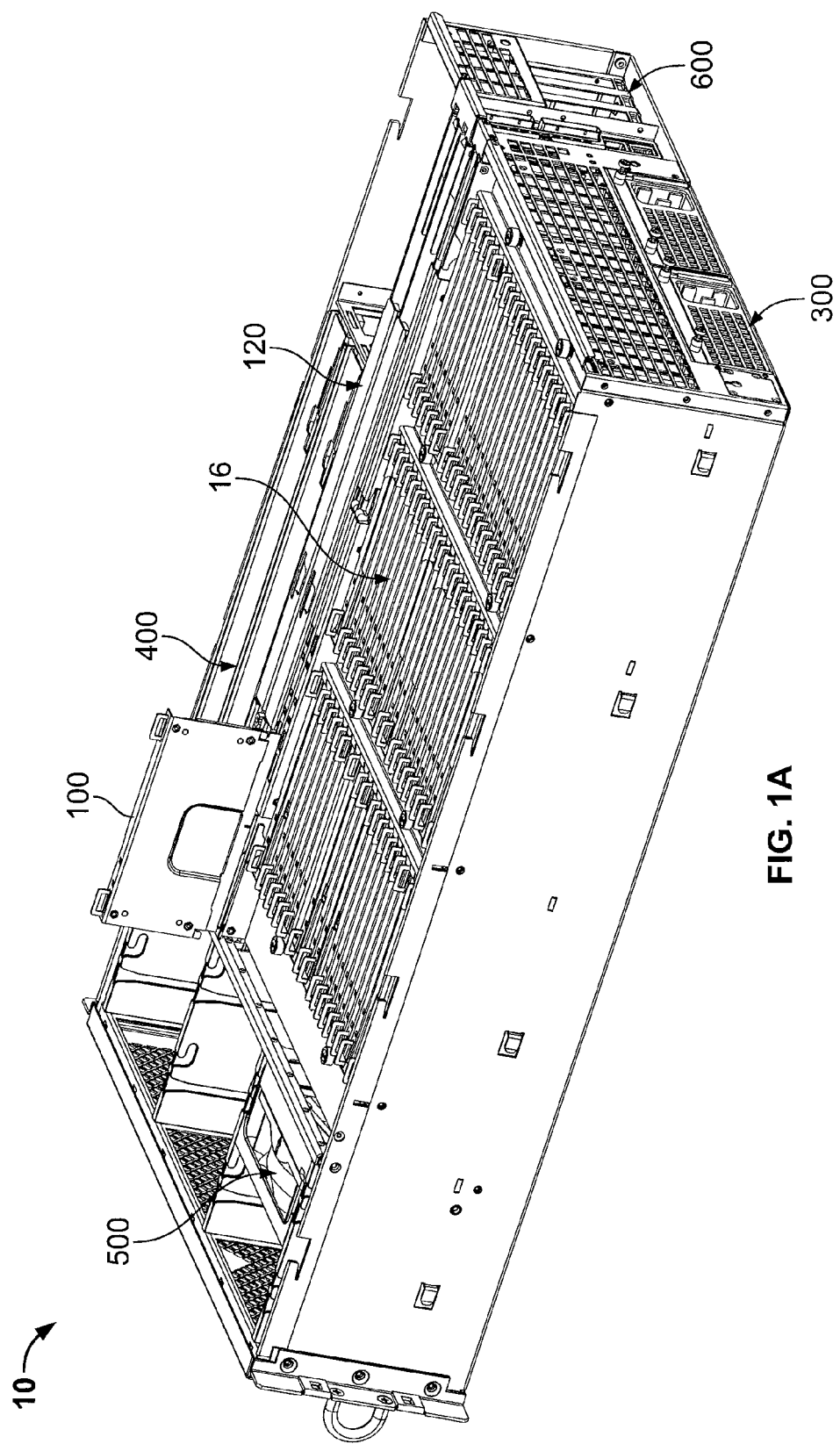
FIG. 1A is a perspective view of an electronics enclosure showing a top accessed circuit card removed from the enclosure.

FIG. 1A shows an equipment chassis 10 having top access for replacing modules such as circuit cards 100. The chassis 10 is shown with a top cover removed and one of the electronic modules 100 of a plurality of similar modules 16 having been removed and positioned above the slot in which it had been mounted. The chassis 10 may have other removable and replaceable components such as a power supply module 300, a power control module 120, fans 500 and external interfaces 600. These components may be connectorized and held in place by fasteners, as is known in the art. However, the inclusion of a particular module or circuit in the present discussion is not intended to be a limitation as they are merely examples of modules, circuits or systems which may employ the concepts disclosed herein.

During a time when a failed component, which may be a module 100 of the plurality of modules 16, has been removed from the chassis, a gap exists between the two modules 100 that were adjacent to the removed module. A replacement module 100 may be inserted into the gap so as to mate with a corresponding connector at the bottom of the gap. During the time that the module 100 has been removed from the chassis 10, a foreign object, such as a screw, screwdriver, test probe, or the like, may fall into the slot.

Figure 1B:
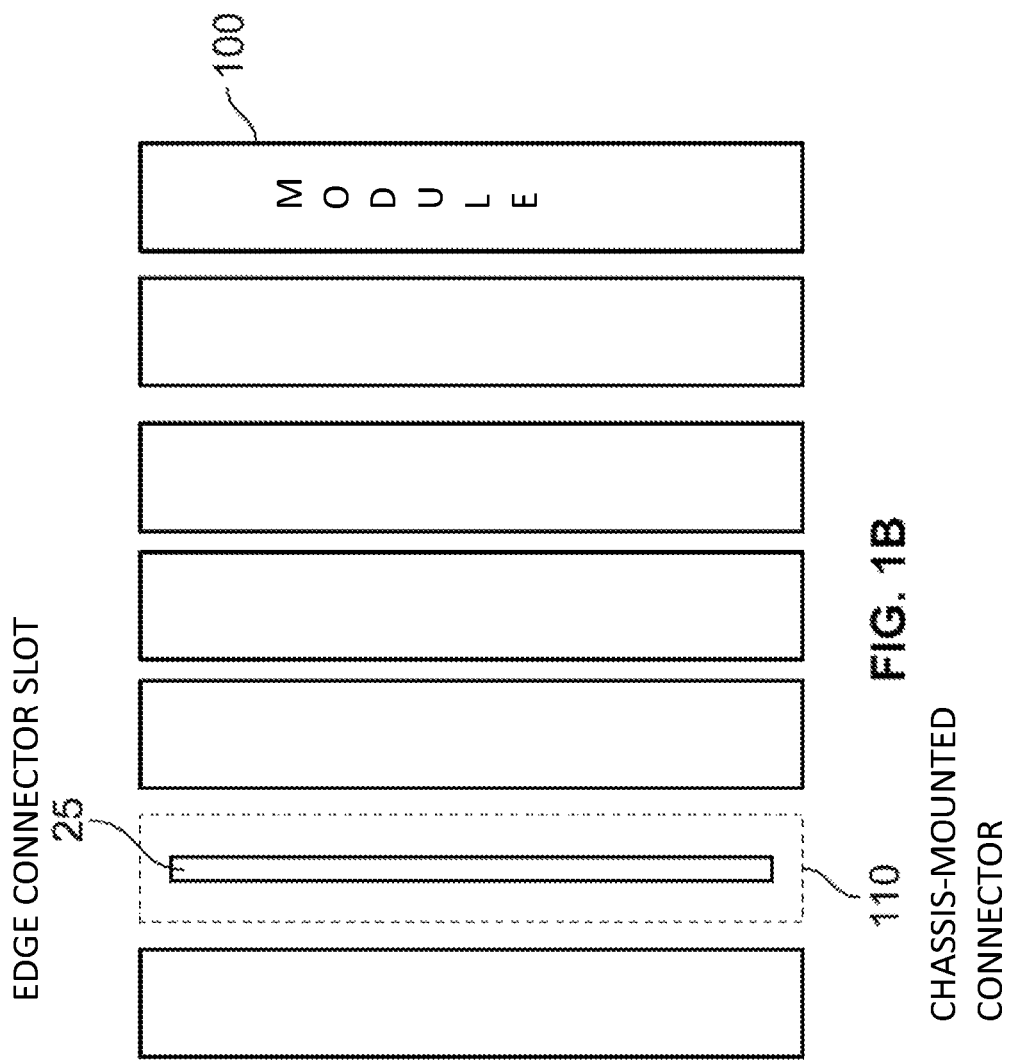
FIG. 1B is a top view of a part of a row of circuit cards of the electronics enclosure showing a connector associated with the removed circuit card of FIG. 1A.

To illustrate this problem, FIG. 1B shows a top view of a plurality of the modules 100 inserted in connectors 110 on a motherboard. The connectors may have one or more rows of connections 25 that are mateable with an inserted module 100. One of the modules 100 has been removed as in FIG. 1A, creating a gap 115 between the modules so that the connector 110 and connections 25 on the motherboard can be viewed. The connector may be, for example, an edge connector having spring contacts 206 along a slot 25 configured to accept an edge of a printed circuit board 100 so as to provide electrical contact between the printed circuit traces (e.g., 201, 202 in FIG. 2) at the edge of the board 101 and connections made to the individual spring contacts 210, 206 of the connector socket. Alternatively, for example, pin and receptacle connections may be used.

During the time that the gap 115 between modules exists, a foreign metallic object may be inadvertently introduced into the gap and cause a short circuit between the exposed contacts (e.g., 206, 210 an) of the connector 110, or between the contacts and the chassis. This type of induced fault is often not considered when designing a system as it is thought to be unlikely. However, in a high availability (HA) configuration, this possibility cannot be ignored, particularly when top access is provided and metallic tools or test probes are used in servicing the equipment.

Figure 2:
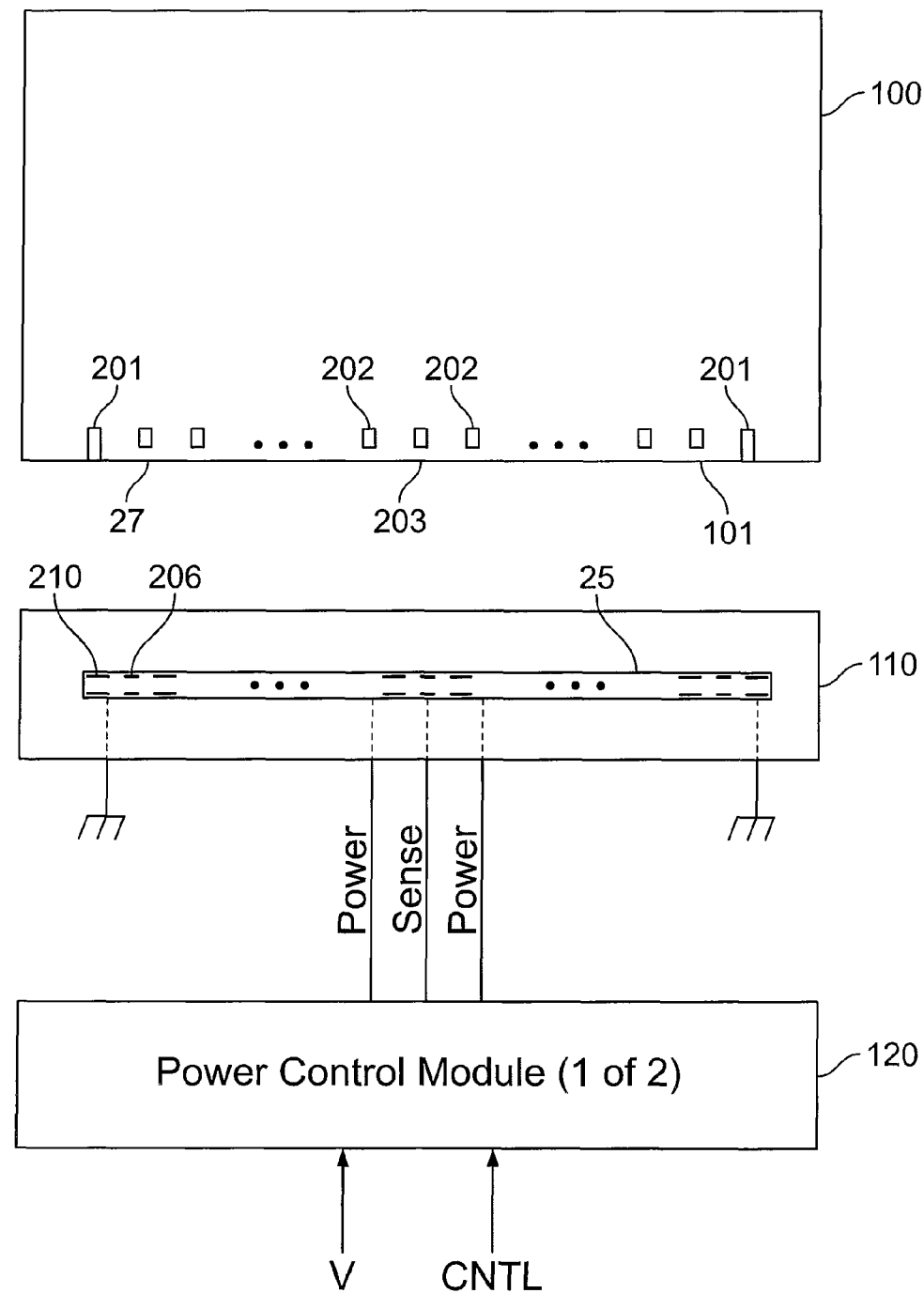
FIG. 2 is a partial schematic representation of the relationship of signal and power contacts on a circuit card and a corresponding connector and power control module.

FIG. 2 shows an electrical configuration intended to prevent damage due to an induced fault as described above. In an aspect, the circuit card 100 may have at least one long pin 201, extending further towards the edge 101 of the circuit card 100 so that the pin 201 is the first to make contact with a corresponding spring 206 or socket on the mating connector 110. The long pin 201 may mate with a ground socket 210 and the pin and socket may be located on at least one end of the circuit board 100 and connector 110, respectively. Where a ground pin 201 is located at either end of the circuit board 100, at least one of the ground pins will have made contact with the connector before any other of the pins have made contact. Another pin 203, which may be termed a sense pin may be located at some suitable location along the circuit board, such that contact is made with the mating connector socket after the ground pin is engaged with the connector. The sense pin 203 may be used to control the power being supplied to the circuit card through the connector by one or more power supply pins 202. The length of the sense 203 pin may be selected so that the sense pin 203 contacts the corresponding spring 206 in the connector 110 after the power pins (e.g. 202) make contact during insertion of the circuit card 100 into the connector 110. This also means that the sense pin 203 may disengage from the corresponding spring contact 206 of the connector 110 before the power pin 202 disengages from the corresponding spring 206. The number and location of the power supply pins 202 may be selected based on a variety of considerations and may supply either a single voltage level or a plurality of voltage levels. Where single voltage level is supplied, further voltage conversion and regulation may occur on the circuit card 100. The configuration of lengths of the various traces on the circuit card 110 and the locations of pins having differing functions is selected to achieve specific system goals, and the present arrangement is merely exemplary.

Each circuit card 100 of the plurality of circuit cards 16 may be connected to a separate power supply controller located in a power control module 120. One or more sense connections 203 may be made between the power control module 120 and the individual circuit card 100. One or more power connections 202 may be made between the power control module 120 and the individual circuit card 100. A plurality of power supply controllers 125 may be located on the power control module 120, corresponding to the plurality of circuit cards 100 being supplied with power supply voltages from the power supply module 120. The power supply controllers 125 of the power supply module 120 are supplied with a voltage V of suitable current capacity by a power supply 300, which may be a redundant power supply, and serves to convert a source of power to the appropriate voltage and having appropriate current capacity, noise levels and other characteristics for the intended application. Although only a single supply voltage is shown, more than one supply voltage may be controlled in this manner.

Figure 3:
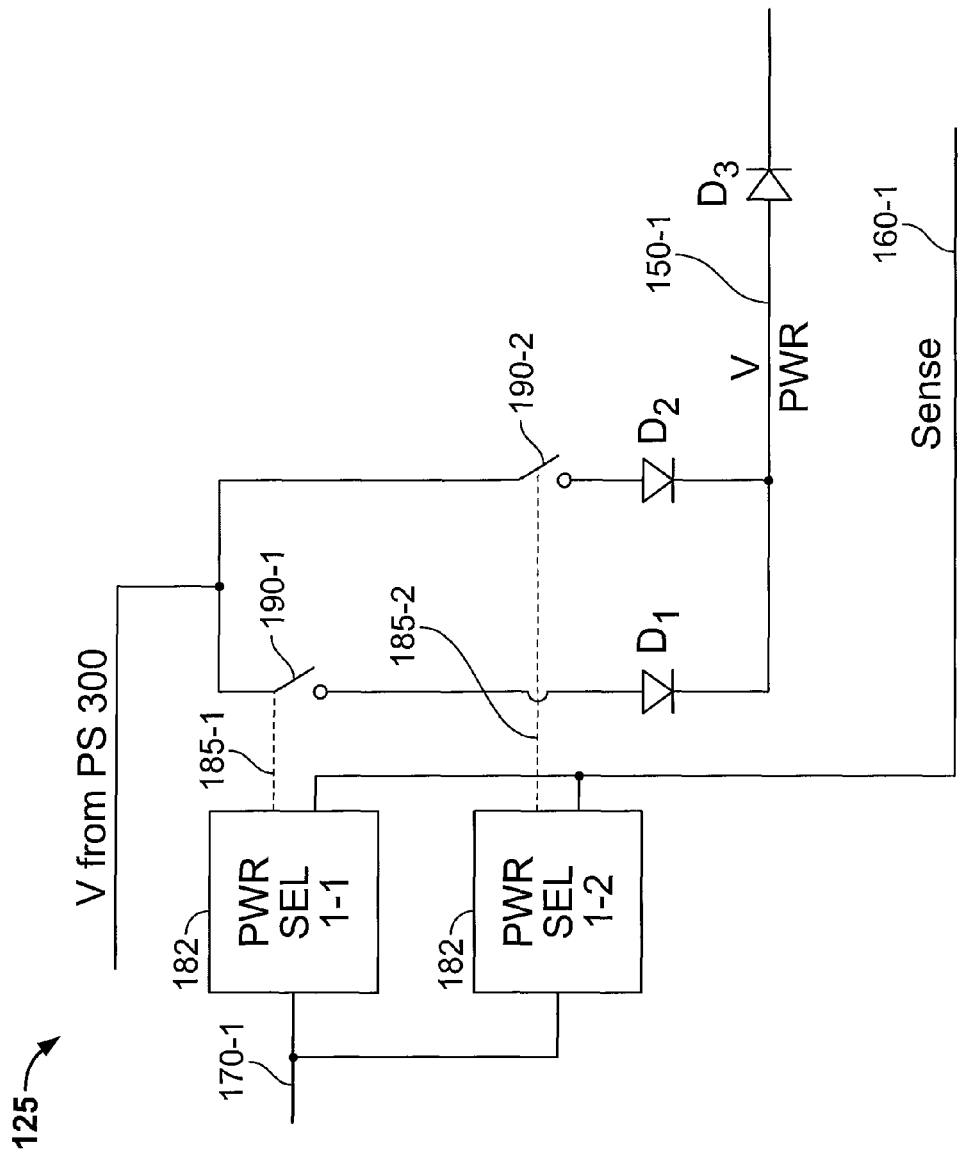
FIG. 3 is a simplified schematic diagram of a redundant power control module.

FIG. 3 illustrates a power supply controller 125 of the power control module 120 configured to provide a voltage V on the connection between the power control module 120 and the connected circuit card 100 when the circuit card is inserted into the mating connector 110 and at least the ground pin 201 is mated with the corresponding socket 206. The voltage may enabled when the sense pin 203 mates with the corresponding socket on the connector 110. The length of the sense pin 203 may be either greater than that of the power pin 202 or less than that of the power pin 202. This is a design choice that is governed by whether it is desired that the power pin 202 be engaged with the corresponding connector socket prior to the application of a voltage V to the line. The ground pin 201 may be configured to be, for example, an end pin of the plurality of pins of the circuit card 100 to engage with a connector socket spring 206 and the last pin of the plurality of pins of the circuit card 100 to disengage from the corresponding connector socket spring 206. Other connector arrangements to achieve an equivalent functional result would be apparent to a person of skill in the art. For example, a plurality of connectors may mate with the circuit card.

When the sense pin 203 is engaged with the corresponding socket spring 206 of the connector 110, the power supply controller 125 may enable a voltage V to be applied to the line connecting to the power pin 202. So, each of the individual circuit cards 100 may have a separate power supply controller 125 such that there is no voltage on the socket of the connector 110 corresponding to the circuit card 100 unless the circuit card is engaged with the socket and the appropriate ground connections made. In this manner, any individual circuit card 100 may be removed from a chassis 10 without creating a situation where an inadvertent short circuit may disrupt the operation of other circuit cards of the system. In a conventional design, all of the circuit cards would have been provided with the power requirements by a single power supply distributed, for example, over a power plane of a printed circuit board, or by a wire harness, with no intermediate control of the power to each module. While such a power supply may be configured as a redundant power supply, a short circuit on a connector would affect all of the modules as the power may be supplied by a power bus connecting to all of the circuit cards, or at least a group of circuit cards in parallel.

In another aspect, another pin of the circuit card 100 may be connected to the pin 201 which would connect to ground when the circuit card 100 is plugged into the connector 110. This would provide a sensing of the ground connection made by the insertion of the circuit card 100 into the connector to be communicated the power supply controller 125 associated with the circuit card 100. The power supply controller 125 may be configured so that both the ground sensing connection and the insertion sensing connection 203 indicated that the card 100 has been inserted into the connector 110 before a voltage V is enabled by the power supply controller 125.

In yet another aspect, each power supply controller may have a current limiter (not shown) so that a maximum amount of current that may be supplied by a power supply controller 125 to any circuit card 100 is limited so that a short circuit applied to the connector pins does not result in a loss of power to any other connector 110 being supplied with power by the power control module 120.

Figure 4:
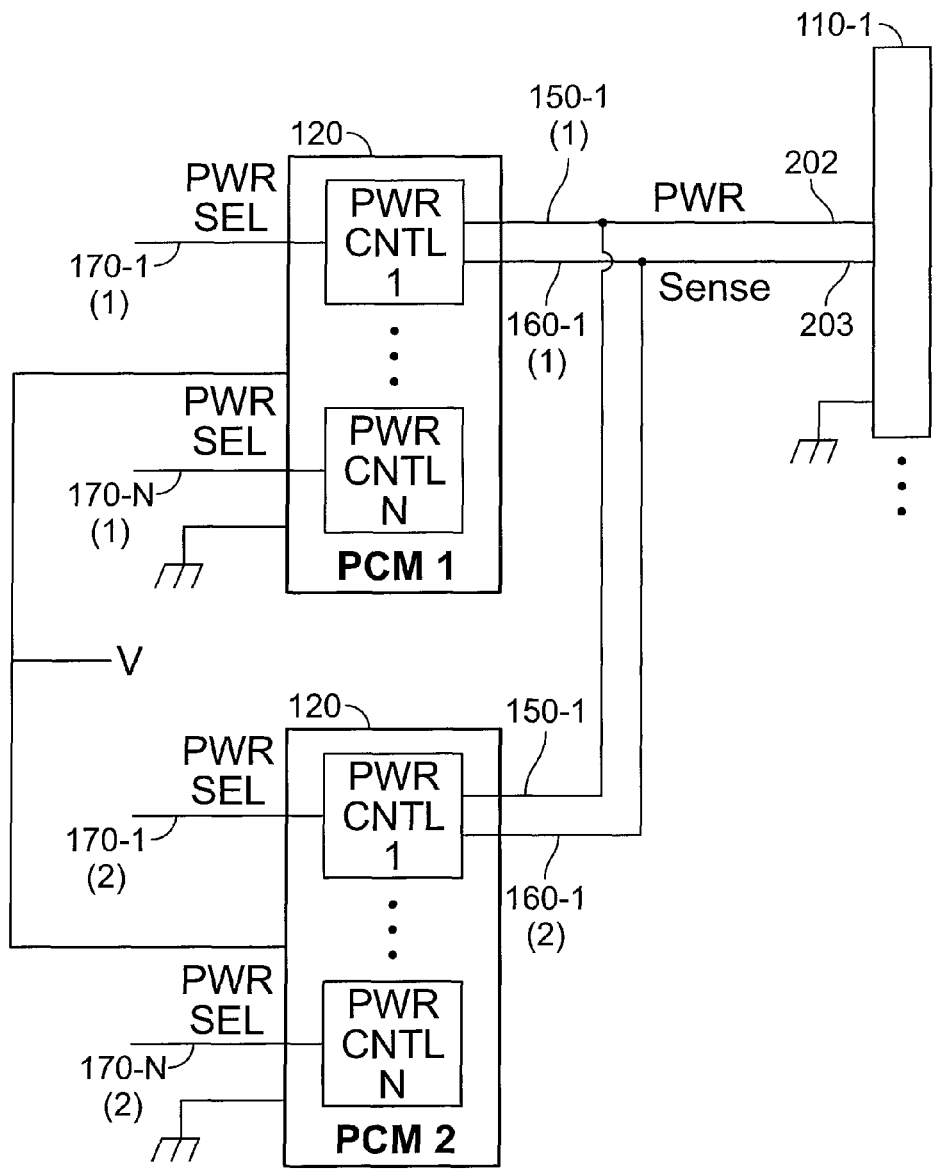
FIG. 4 is a simplified schematic diagram of a pair of redundant power control modules supplying power to a connector.

In order to provide for interruption-free servicing of a power control module 120 the event of a failure of one or more of the components thereof, a plurality of power control modules 120 may be connected in a wired-OR fashion shown in FIG. 4. In such an instance, the failed power control module 120 of the plurality of power controller modules 120 may be removed and replaced while maintaining an uninterrupted supply of power to the connected circuit cards 100.

The level of replaceable redundancy at the module in the system (e.g., power control module, power supply module) and the level of redundancy in each module may be dependent on the reliability and availability requirements of each product, and products may be designed or configured to meet differing end user requirements.

As shown in FIG. 3, the power supply controller 125 may have a redundant control 182 for controlling the voltage V. The input voltage V is supplied by a power supply 300, which may also be a redundant power supply, and the voltage supplied to the circuit card 100 may controlled by switches 190-1 and 190-2, being activated based on the presence of, for example, a sense connection 203. A sensing of a ground connection of the circuit card 100 may also be required. The voltage V may be applied to the input of two or more switches 185, which may be FET (field effect transistors) or other switch types 190 configured such that the voltage may be connected or disconnected from an output line 150-1 independently. The failure of one switch of the pair 190-1 or 190-2 in the open position would not result in loss of power control. The output of the switches 190 may be combined in a wired-OR configuration and may employ diodes D1, D2, or other circuitry to prevent current from flowing from the line 150-1 back through the switches 190.

The characteristics of switches 190 may be that the switch actuating first prevents the other of the switches from delivering more than a nominal amount of current to the output line 150-1. In that circumstance, the second of the two switches is active and connected, and can supply the full current demands of the circuit card 100 in the event of failure of the other switch. The switches 190 may also include voltage regulators, current limiters and other electronic components.

In another aspect, the operation of the switches 190 may be controlled by an external control signal 170-1 that is furnished by a system controller. Where there are two power control modules 120, such as shown in FIG. 4, the system controller may operate to set the control signals such that one of the power control modules 120 is actively supplying power while the other of the power control modules 120 is connected, but not supplying current. In such a circumstance, the failure of a power supply controller 125 in a power control module 120 would be actively protected by the corresponding power supply 125 module in the other power control module 120.

Where the supply of current by power supply controllers 125 connected in an OR configuration is controlled by permitting the first of the current paths to reach a predetermined voltage to supply the entire current requirement, the operation may be managed by appropriate sequencing of the switches 190 of the power supply controllers 125 that are connected in a OR-type configuration. After initialization, the current supplied by each of the switches may be monitored. A first switch (e.g. 190-1) may be determined to be supplying the current, with the other switches (e.g. 190-2) connected, but not supplying current. Thus, if the switch presently supplying current were to fail, one of the remaining switches 190 would continue to supply the load. So, the first switch is effectively disconnected, and one of the remaining switches will supply the required current. The switches 190 may be tested in a sequence during the initialization of the system, or whenever power is being restored to a circuit card 100 that has been hot swapped.

The plurality of switches 190 supplying current to the circuit card 100 may also be operated in a current sharing mode. That is, the current flow through each of the switches 190 that are connected in the wired-OR circuit may be controlled so that the current supplied by each of the switches is nominally the same, so that power dissipated in each switch circuit is reduced. As a fault-free situation is the most likely state, where there is no failure, the maximum operating temperature any one of the switches may be reduced from the situation where only one of the switches is supplying all of the current. Since it is known that the reliability of electronic components degrades with increasing operating temperature, this configuration may result in an overall increase in reliability. Whether current sharing is used will depend on the specific design criteria for each application.

When a failure in one or more switches 190 is encountered, and there are redundant power control modules 120, the current load may be transferred to one of the power control modules 120 that is operable, and the power control module 120 having the failed component can be hot swapped.

Since a failure of a power supply controller 125 in the power control module 120 may result in the loss of redundancy in the control of power to a circuit card 100, a redundant power control module 120 may be provided, as shown in FIG. 4. Here, two power control modules 120 are connected such that the voltage outputs of the power supply controllers 125 connecting to a particular circuit card 110 are connected in an OR-type circuit. The sense circuits for the individual circuit card 100 are connected to both of the power control modules 120. In this manner, the failure of any one of the power supply controllers 125 associated with a circuit card 100 does not result in loss of power to the circuit card 100. One of the power control modules 120 may be removed and replaced.

Where the term "OR-type circuit" or "wired-OR" configuration is used, it would be understood that a variety of electrical or electronic circuits may be used to realize the requirement that the power is supplied to an output of the power source when power is supplied by any one of the connected sources of power. This may be done, for example, by connecting wires together in parallel. In other examples, the wires may be configured for directional current flow using diodes, FET switches or the like and may share the supplying of the required power. Alternatively, one of the sources may dominate the supply at any particular time, with the other sources being effectively dormant until the source supplying power is deactivated for some reason. When such a situation obtains, one of the other sources connected to the OR-type circuit immediately provides the required power.

Figure 5:
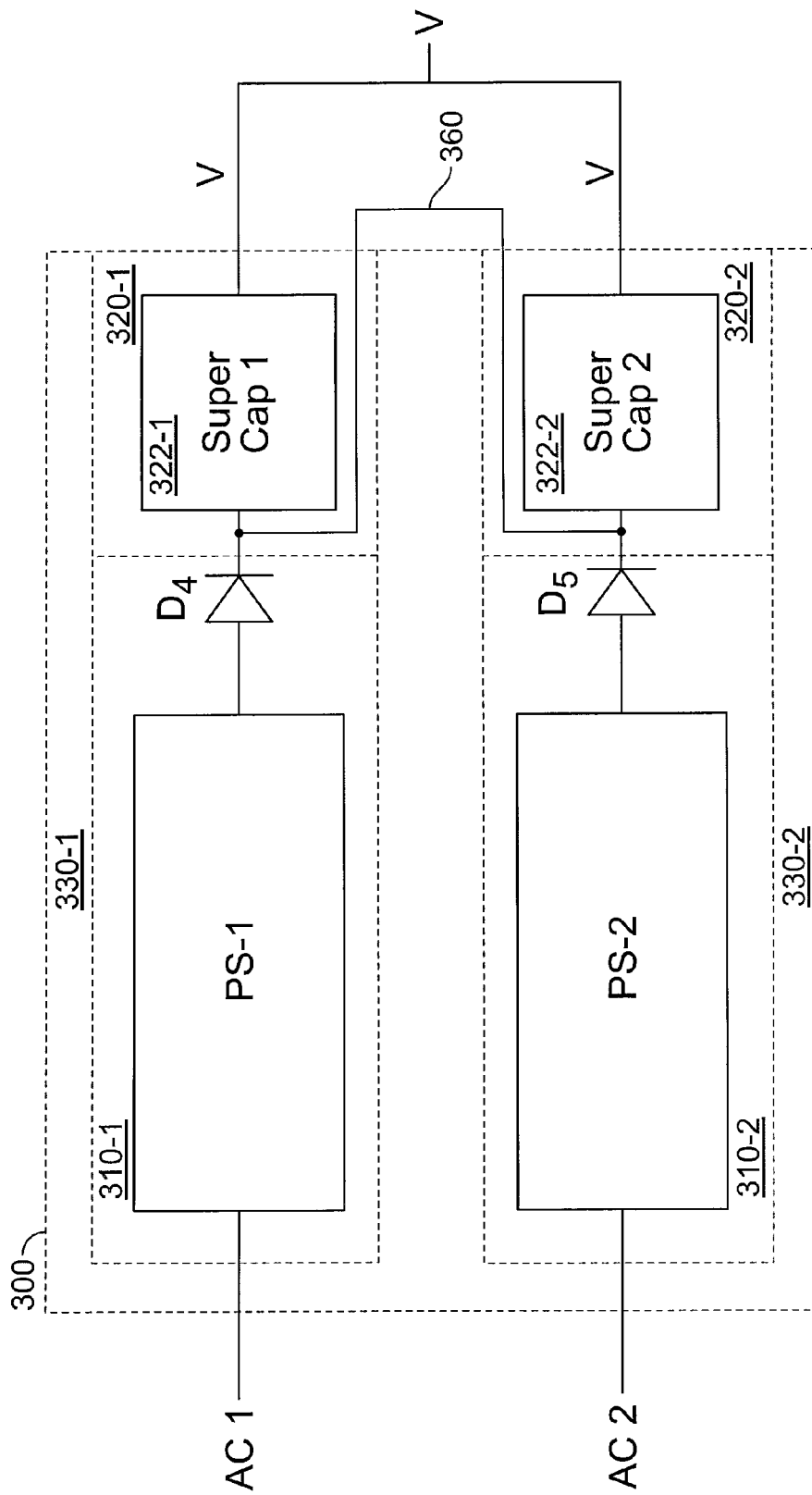
FIG. 5 is a block diagram showing two power supply modules with reserve power devices connected in a dual redundant configuration.

In the example of FIG. 4, the input voltage V to the power control modules 120 is connected in parallel and may be supplied by a redundant power supply 300 (see FIG. 5). In an alternative, each of the power supply modules is supplied with the voltage V from an independent power supply 310. In either instance, the power supply (300 or 310) is capable of supplying the entire current requirements of the plurality of circuit cards 100 connected to a power control module 120. The present example is configured so that a defective power supply controller 125 may be replaced by removing and replacing the corresponding power control module 120. The redundant aspects of the power control modules 120 may be used to automatically switch on the load of the removed power control module 120. Alternatively, sense pins (not shown) interconnecting the power control modules 120 may be used to sense the impending removal of a power control module 120. The operation of such sensing and control circuits would be similar to that previously described for the circuit cards, as would be understood by a person of skill in the art having the benefit of this description.

In another aspect, the operation of each of the power supply controllers 125 may be controlled by an external voltage level 170, which may be used by the controller of the system (not shown) to manage the operation of the power control modules 120.

Many computing systems use a combination of volatile and non-volatile memory for the storage of state information, programs, data and the like. When a power interruption occurs in such as system, data may be lost unless the impending loss of power can be sensed, and the requisite data transferred from volatile memory to non-volatile memory before the computer system ceases to function properly.

Generally, power would need to be supplied to both the volatile and the non-volatile memory and a least a portion remainder of the computer system during this time. In some systems, the amount of energy stored in the power supply smoothing capacitors, or in other circuits, may be sufficient to accomplish this function. However, in many computing systems, an additional source of stored energy may be needed to permit an orderly shutdown. While such power loss events are very rare in a well-designed high availability system, the essence of high availability is that vigorous efforts in system design are made to avoid a disorderly shut down or data loss when the power fails, or when there is a component failure.

Batteries or supercapacitors may be used to provide a short term source of energy when performing an orderly shutdown. However, it is known that both of these energy storage modes have a finite component lifetime. As the objective of a high-availability design would be to achieve an orderly shutdown with no data loss over the operating lifetime of the system, the lifetime of the battery or supercapacitor is a concern. In a manner similar to fans and filters (if used) routine maintenance may need to be performed in order to achieve this design objective. As is well known, mistakes happen, and they most often occur during maintenance activities.

A high-availability computer system may have redundant power supplies, as shown in FIG. 5. Each power supply 300 may have a power conversion module PS and a stored energy component 322, which may be a supercapacitor, rechargeable battery, or the like. Various configurations of the stored energy component 322 are known, where, for example, a rechargable battery may be floated on the output of the power conversion module 310, or separately charged and switched into the circuit where needed, or the like. The power conversion module 310 may serve to interface between a first source of electrical energy and the remainder of system by converting the voltage to an appropriate level, regulating the voltage and providing filtering. The first source of energy may be an AC power source or a DC power source, and the power conversion module output may one or more voltages, to meet specific system requirements. Often, the two power supplies in a redundant power supply configuration are supplied by independent first sources. In this description, for simplicity, the power conversion module may output a single voltage V; however, this is not intended to be a limitation.

Due to the configuration of the power conversion modules 310, the supercapacitors or batteries may not be conveniently accessible from an exterior surface of the system chassis 10. The connectors used to join the power conversion module to the stored energy component and thence to the system may be designed to carry a high current and may need to be protected against inadvertent short circuiting during servicing. Moreover, the stored energy modules 322 are more likely the source of a failure than the power conversion modules 310.

In U.S. 61/666,526, entitled "Power Supply and Circuit Module for Data Processing Systems," filed on Jun. 29, 2012, a power supply module is disclosed where the power conversion module 310 and the stored energy module 322 are separate components mounted in a carrier 330. The carrier 330 is slidably insertable into an aperture in the chassis so as to mate with a connector to supply power to the remainder of the computer system. The application is commonly owned and is incorporated herein by reference.

As shown in FIG. 5 a pair of such power conversion modules 310 may be connected so as to provide enhanced redundancy in the case of more than one of the power conversion modules 310 and stored energy modules 322 fails before a repair action can be undertaken. In this configuration, the two power conversion modules (310-1, 310-2) are connected in a wired-OR configuration using diodes D4 and D5 and connected through a connectorized path 360 when the full power supply module 300 is inserted into the chassis. This connection is present whether or not the stored energy device 322 is present. So, either of the power conversion modules 310-1, 310-2 can supply either of the energy storage modules 322-1, 322-2 with sufficient power to operate the computer system. Either of the power conversion modules 310 may encounter a failure and either of the energy storage modules may encounter a failure, yet the system will continue to operate and the fault may be repaired without interrupting the operation of the system. Similarly either of the energy storage modules 322 may encounter a failure, yet the system will continue to operate and the fault may be repaired without interrupting the operation of the system. Where the stored energy device 322 is routinely subject to preventive maintenance, for example by being periodically replaced, the same procedure may be used.

The independent dual redundancy of separate components of the power supply portion of the system protects against loss of the full function of the computer system. Moreover, since the actions needed to prevent the loss of data, described earlier, may depend at least in part on the availability of the stored energy device, a failure in the power supply may have a disproportionate effect on the overall system reliability and availability.

Although not described, a person of skill in the art would recognize that other control signals may be interconnected between the power supplies 310-1 and 310-2 by the connection path 360, and that some of these signals may also be sensed by the remainder of the computer system so as to either take precautions regarding shut down, notify the operator of a failure, or the like.

Although only a few exemplary embodiments of this invention have been described in detail above, those skilled in the art will readily appreciate that many modifications are possible in the exemplary embodiments without materially departing from the novel teachings and advantages of the invention. Accordingly, all such modifications are intended to be included within the scope of this invention.

What is claimed is:

1. An electronics chassis, comprising:
   an interface to a power supply providing a voltage;
   a plurality of chassis-mounted connectors, each chassis-mounted connector having a plurality of contacts sized and dimensioned to be mateable with a circuit card; and
   redundant power control modules electrically configured to receive the voltage from the power supply through the interface to the power supply and disposed between the interface to the power supply and a chassis-mounted connector of the chassis-mounted connectors, wherein a power control module of the redundant power control modules further comprises: a plurality of power control circuits having redundant switches electrically disposed between the interface to the power supply and the chassis-mounted connector, and outputs of switches of the redundant switches are connected in a wired-OR configuration;

a control circuit activated by a sense signal to activate the redundant switches of a power control circuit of the power control circuits; and the outputs of the redundant power control modules are connected in a wired-OR configuration for the chassis-mounted connector so that the power control module of the power control modules can be removed while maintaining an uninterrupted voltage at the chassis-mounted connector.

2. The chassis of claim 1, wherein the chassis-mounted connector is configured to have at least one contact near a proximal end thereof that is connected to a power ground.

3. The chassis of claim 2 wherein the chassis-mounted connector is configured to have a sense contact near a location approximately equidistant from ends of the connector.

4. The chassis of claim 3, wherein the contacts are positioned such that a circuit card inserted into the chassis-mounted connector makes electrical contact with a ground contact prior to making contact with the sense contact.

5. The chassis of claim 4, wherein a power contact on the chassis mounted connector makes contact with a corresponding power connector prior to making contact with the sense contact.

6. The chassis of claim 4, wherein a power contact on the chassis mounted connector makes contact with a corresponding power connector after making contact with the sense contact.

7. The chassis of claim 3, wherein the sense contact provides sense signal when a circuit card ground contact has connected with a chassis-mounted connector ground contact.

8. The chassis of claim 1, wherein the power control module is a removable connectorized module.

9. The chassis of claim 1, wherein the sense signal is a first sense signal and a second sense signal.

10. The chassis of claim 9, wherein the first sense signal is a ground when an inserted circuit card has made a connection to a ground of the chassis.

11. The chassis of claim 9, wherein the first sense signal is a ground when an inserted circuit card has made a connection to a ground of the chassis and has not made a connection to a power connection.

12. The chassis of claim 9, wherein the first sense signal is a ground when an inserted circuit card has made a connection to a ground of the chassis and has made a connection to a power connection.

13. The chassis of claim 9, wherein a voltage is applied to a pin of the connector when the first and the second sense signals are a ground.

14. The chassis of claim 1, wherein a voltage is applied to a pin of the connector when the sense signal is a ground.

15. The chassis of claim 14, wherein the control circuit is activated by the sense signal.

16. The chassis of claim 15, wherein the control circuit activates a plurality of redundant switches having an OR-type output connection.

17. The chassis of claim 1, further comprising:

a circuit card mateable with the chassis mounted connector, wherein the connections between the circuit card and a first and a second sense connection of chassis mounted connector are arranged and dimensioned such that a connection is made between a ground connection of the connector and the first sense connection of the circuit card prior to a connection being made between a power connection of the connector and a power connection of the circuit card; and, a connection is made between a second sense connection of the circuit card and the second sense connection on the connector after the connection has been made between the power connection of the connector and the power connection of the circuit card.

18. The chassis of claim 1, wherein each of the redundant power control modules is connected to a separate power supply interface.

19. The chassis of claim 1, wherein the chassis includes the power supply and the power supply comprises a plurality of power supplies connected in a wired-OR configuration that includes a supercapacitor between each power supply of the plurality of power supplies and the interface.

* * * * *